US009276029B1

(12) United States Patent
Lu et al.

(10) Patent No.: US 9,276,029 B1
(45) Date of Patent: Mar. 1, 2016

(54) OPTICAL ISOLATION GRID OVER COLOR FILTER ARRAY

(71) Applicant: OMNIVISION TECHNOLOGIES, INC., Santa Clara, CA (US)

(72) Inventors: Chen-Wei Lu, San Jose, CA (US); Chia-Ying Liu, Hsinchu (TW); Yin Qian, Milpitas, CA (US); Jin Li, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/601,016

(22) Filed: Jan. 20, 2015

(51) Int. Cl.
*H01L 31/0232* (2014.01)
*H01L 27/146* (2006.01)

(52) U.S. Cl.
CPC ...... *H01L 27/1463* (2013.01); *H01L 27/14621* (2013.01); *H01L 27/14627* (2013.01); *H01L 27/14645* (2013.01)

(58) Field of Classification Search
CPC .................................. H01L 27/1463
USPC ........................................... 257/432
See application file for complete search history.

(56) References Cited

U.S. PATENT DOCUMENTS 8,269,264 B2    9/2012   Nozaki et al.
8,507,964 B2    8/2013   Nozaki et al.

*Primary Examiner* — Anthony Ho
(74) *Attorney, Agent, or Firm* — Blakely Sokoloff Taylor & Zafman LLP

(57) ABSTRACT

A color image sensor includes a plurality of pixel cells arranged in a pixel array. A plurality of color filters is arranged in a color filter array disposed over the pixel array. Each color filter is aligned with a corresponding underlying pixel cell. An optical isolation grid is disposed over the color filter array such that incident light is directed through the optical isolation grid prior to be being directed through the color filter array to the pixel array. The optical isolation grid includes a plurality of sidewalls arranged to define a plurality of openings in the optical isolation grid. Each opening is aligned with a corresponding color filter such that each color filter is optically isolated by the optical isolation grid to receive incident light only through a corresponding aligned one of the plurality of openings.

19 Claims, 2 Drawing Sheets

OPTICAL ISOLATION GRID OVER COLOR FILTER ARRAY

BACKGROUND INFORMATION

1. Field of the Disclosure

This invention is related to image sensors, and more particularly, to color filter arrays for use in color image sensors.

2. Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

In conventional color image sensors, incident light is typically directed through microlenses and then through color filters of a color filter array to pixel cells of a pixel array. The pixel cells include photosensitive elements to convert the incident light into electrical signals that are proportional to the intensity of the incident light. Color image sensors use the color filter arrays to help capture the color information in the incident light. A color filter array includes a pattern of different colored filters to filter the light that reaches each pixel cell in the underlying color image sensor.

As the pixel cell sizes in color image sensors become smaller, it becomes increasingly challenging for the microlenses to focus all of the incident light through specific color filters of the color filter array to the underlying pixel cells. As a result, there can be undesired crosstalk among the underlying color filters as light that is directed into one color filter ends up leaking into a different unintended color filter in the color filter array. This also causes unwanted crosstalk among the underlying pixel cells. Crosstalk among the color filters in a color filter array, and/or among the underlying pixel cells in the pixel array creates undesirable noise in the image sensor and therefore degrades overall image quality of images captured by the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
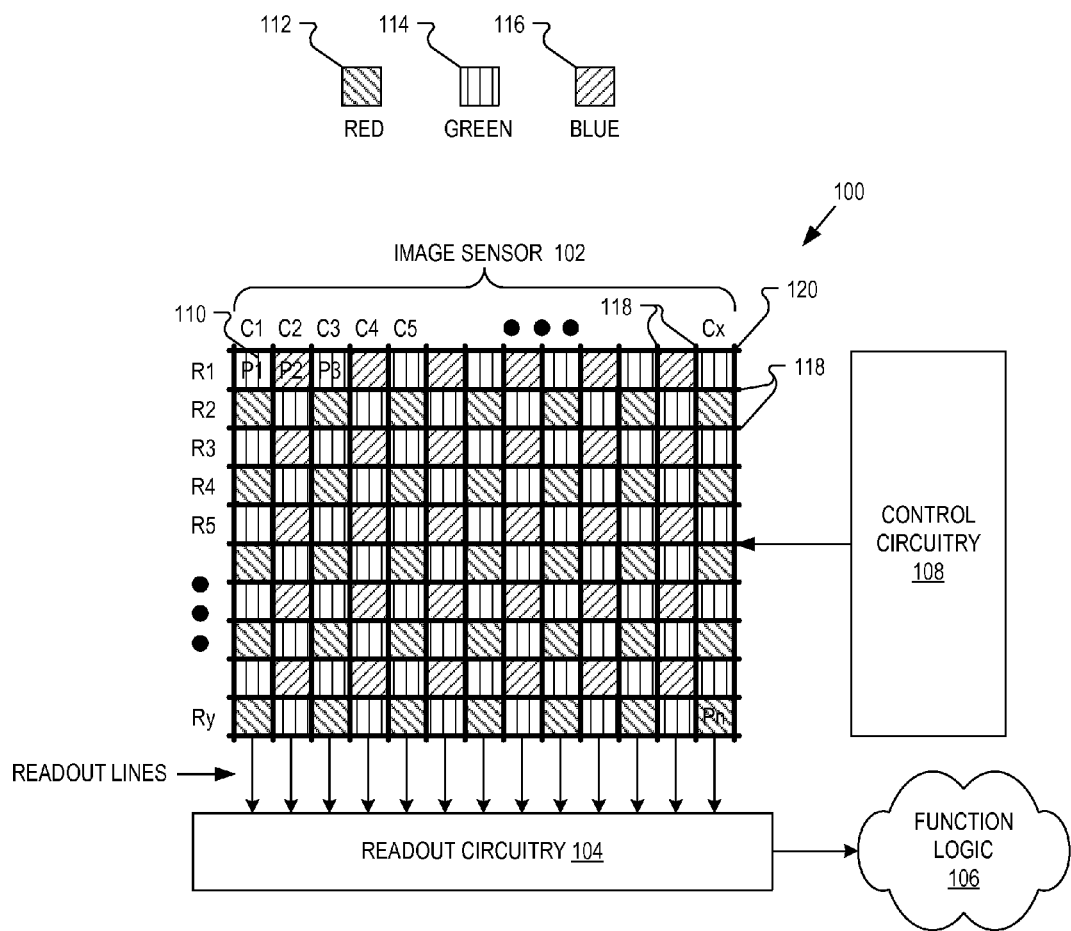
FIG. 1 is a diagram illustrating one example of an imaging system including an image sensor having an optical isolation grid disposed over a color filter array in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an imaging system including an image sensor having an optical isolation grid disposed over a color filter array are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

As will be shown, examples of an imaging system including an image sensor having an optical isolation grid disposed over a color filter array are disclosed. Examples of an optical isolation grid include a plurality of sidewalls that are arranged to define a plurality of openings. In the examples, the optical isolation grid is disposed over a color filter array. Each opening defined in the optical isolation grid is aligned with a corresponding underlying color filter of the color filter array. With the optical isolation grid disposed above the color filter array, the color filters are optically isolated by the optical isolation grid to receive incident light only through the corresponding opening in the optical isolation grid in accordance with the teachings of the present invention.

To illustrate, FIG. 1 is a diagram illustrating one example of an imaging system 100 that includes an image sensor 102 with an optical isolation grid 120 that is disposed over a color filter array 110 in accordance with the teachings of the present invention. In the depicted example, the imaging system 100 includes image sensor 102 with readout circuitry 104, function logic 106, and control circuitry 108 in accordance with the teachings of the present invention.

In one example, image sensor 102 is a color image sensor that includes a two dimensional (2D) array of pixel cells (e.g., pixel cells P1, P2, P3, Pn). In various examples, image sensor 102 may be implemented as a front side illuminated sensor or as a back side illuminated sensor. In one example, color filter array 110 is disposed over the array of pixel cells to assign color information to each of the underlying pixel cells. In one example, color filter array 110 may include red color filters 112, green color filters 114, and blue color filters 116 arranged in a pattern. For instance, as shown in the depicted example, the red color filters 112, green color filters 114, and blue color filters 116 are arranged in a Bayer pattern. It is appreciated of course that other combinations of colors, such as for example clear, cyan, magenta, etc., as well as other patterns may also be utilized in color filter array 110 in accordance with the teachings of the present invention.

As will be discussed in greater detail below, optical isolation grid 120 is disposed over the color filter array 110 such that incident light is directed through the optical isolation grid 120 prior to be being directed through the color filter array 110 to the underlying pixel cells P1, P2, P3, Pn, of the pixel array. The optical isolation grid 120 includes a plurality of sidewalls 118 that are arranged to define a plurality of openings in the optical isolation grid 120. Each one of the plurality of openings in the optical isolation grid 120 is aligned with a corresponding underlying one of the plurality of color filters of color filter array 110, such that each one of the plurality of color filters is optically isolated by the optical isolation grid 120 to receive incident light only through a corresponding aligned one of the plurality of openings of optical isolation grid 120 in accordance with the teachings of the present invention.

As illustrated in the depicted example, each pixel cell in image sensor 102 is arranged into a row (e.g., rows R1 to Ry) and a column (e.g., column C1 to Cx) to acquire image data for an image of a person, place, object, etc., which can then be used to render a 2D image of the person, place, object, etc., in accordance with the teachings of the present invention. For instance, in one example, incident light is directed from an object to the each pixel cell in image sensor 102, only through a corresponding opening in optical isolation grid 120, and through a corresponding underlying color filter of color filter array 110. Image charge is generated in each pixel cell in response to the incident light. After the image charge is generated in the pixel cells, image data that is generated in response to the image charge, is read out by readout circuitry 104 through readout lines, and is then transferred to function logic 106.

In various examples, readout circuitry 104 may include circuitry such as for example amplification circuitry, analog-to-digital (ADC) conversion circuitry, or the like. Function logic 106 may include digital circuitry and may simply store the image data, or may even manipulate the image data with image signal processing techniques to apply post image effects (e.g., crop, rotate, remove red eye, adjust brightness, adjust contrast, or otherwise). In one example, readout circuitry 104 may read out a row of image data at a time along the readout lines (illustrated), or may read out the image data using a variety of other techniques (not illustrated), such as for example a serial read out or a full parallel read out of all pixels simultaneously.

In one example, control circuitry 108 is coupled to pixel cells in the image sensor 102 to control operational characteristics of image sensor 102. For example, control circuitry 108 may generate a shutter signal and other control signals coupled to pixel cells included in the image sensor 102 to control image acquisition. In one example, the shutter signal may be a global shutter signal for simultaneously enabling all pixel cells included in the image sensor 102 to simultaneously capture their respective image data during a single acquisition window. In another example, the shutter signal may be a rolling shutter signal such that each row, column, or group of pixels is sequentially enabled during consecutive acquisition windows.

Figure 2:
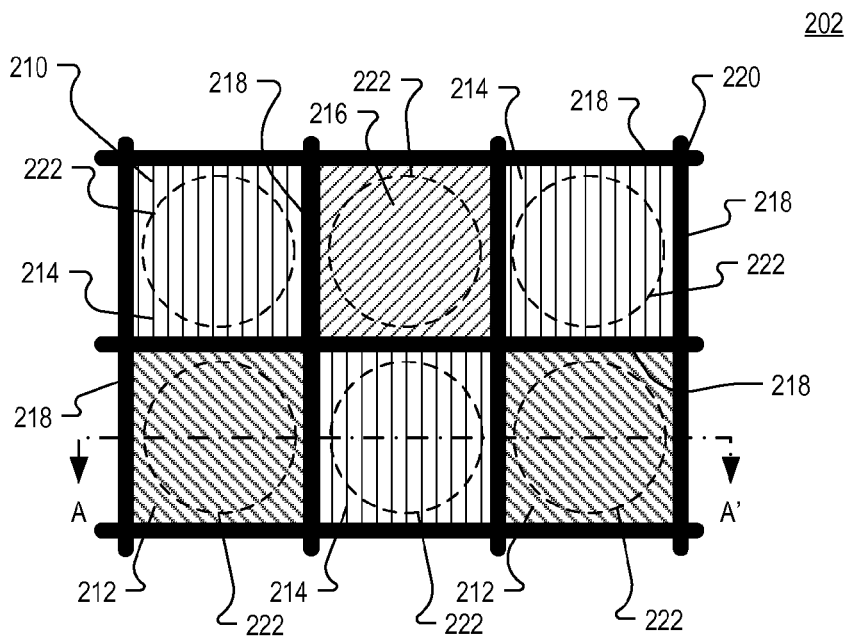
FIG. 2 is an example plan view diagram that illustrates an image sensor having an optical isolation grid disposed over a color filter array in accordance with the teachings of the present invention.

FIG. 2 is an example plan view diagram that illustrates a portion of an example image sensor 202 having an optical isolation grid 220 disposed over a color filter array 210 in accordance with the teachings of the present invention. It is noted that color image sensor 202 of FIG. 2 is another example of color image sensor 102 of FIG. 1, and/or that color filter array 210 of FIG. 2 is another example of color filter array 110 of FIG. 1, and/or that optical isolation grid 220 of FIG. 2 is another example of optical isolation grid 120 of FIG. 1. Accordingly, it is appreciated that similarly named and numbered elements referenced below are arranged and function similar to as described above.

Continuing with the example depicted in FIG. 2, color filter array 210 includes a plurality of color filters arranged in a pattern. For instance, in the example depicted in FIG. 2, the first row of color filters includes a green color filter 214, a blue color filter 216, and a green color filter 214. The second row of color filters includes a red color filter 212, a green color filter 214, and a red color filter 212. Thus, the color filters of example color filter array 210 of FIG. 2 are arranged in a Bayer pattern. It is appreciated of course that other combinations of color filters and patterns may also be utilized in color filter array 210 in accordance with the teachings of the present invention.

The example depicted in FIG. 2 also illustrates optical isolation grid 220 disposed over color filter array 210 in accordance with the teachings of the present invention. In the depicted example, optical isolation grid 220 includes a plurality of sidewalls 218 that define openings between the sidewalls 218 as shown. In one example, the material used to form the plurality of sidewalls 218 may be a transparent material having an index of refraction of $n_1$. Each one of the plurality of openings in optical isolation grid 220 is aligned with a corresponding underlying one of the plurality of color filters of color filter array 210. For instance, as shown in the example depicted in FIG. 2, the openings defined by the plurality of sidewalls 218 of optical isolation grid 220 in the first row are aligned with the underlying green color filter 214, blue color filter 216, and green color filter 214 of color filter array 210 as shown. The openings defined by the plurality of sidewalls 218 of optical isolation grid 220 in the second row are aligned with the underlying red color filter 212, green color filter 214, and red color filter 212 as shown.

The example depicted in FIG. 2 further illustrates that image sensor 202 may also include an array of microlenses 222 that are disposed over the optical isolation grid 220 in accordance with the teachings of the present invention. As shown in the depicted example, each one of the microlenses 222 of the array of microlenses is aligned with a corresponding one of the plurality of openings of the optical isolation grid 220. In one example, the array of microlenses 222 is formed with a lens material, and the plurality of openings in the optical isolation grid 220 is filled with the lens material of the array of microlenses 222 as shown. In one example, the lens material that is used to form the array of microlenses 222 has an index of refraction of $n_2$. In one example, the index of refraction of the plurality of sidewalls 218, $n_1$, is less than the index of refraction of the lens material of the array of microlenses, $n_2$. In one example, since the lens material of the microlenses 222 has a different index of refraction than the material used to form the sidewalls 218, incident light that is directed through microlenses 222 to an interface between the material of microlenses 222 and the material of sidewalls 218 is deflected in accordance with the teachings of the present invention.

Figure 3:
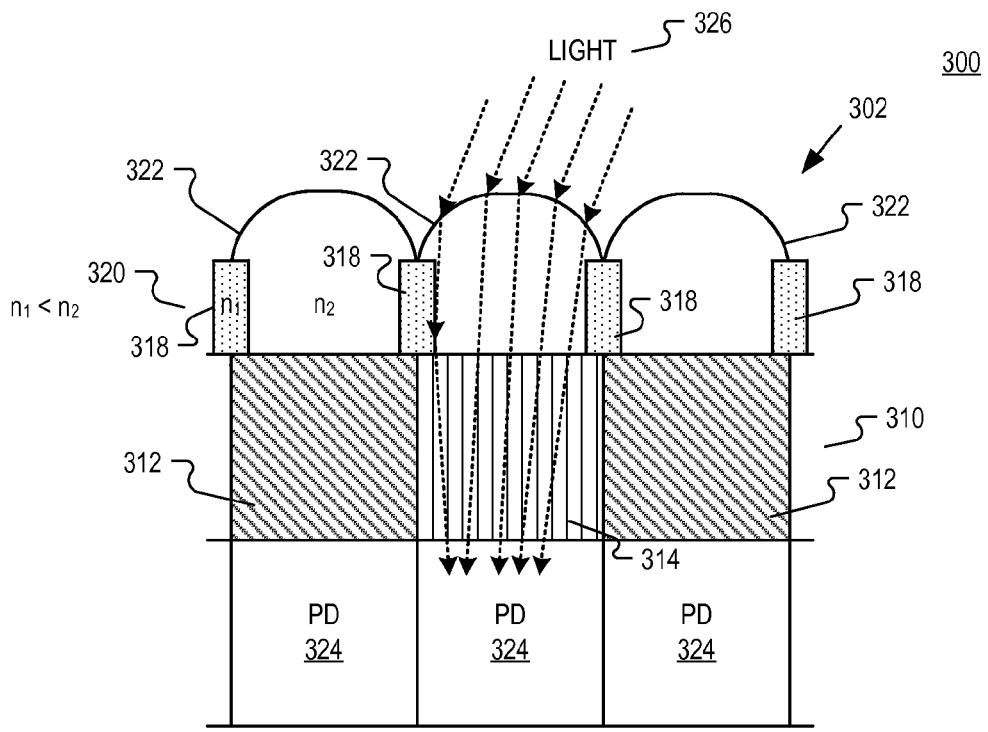
FIG. 3 is an example cross-section view illustrating one example of a portion of an imaging system including an array of microlenses disposed over an image sensor having an optical isolation grid disposed over a color filter array in accordance with the teachings of the present invention.

To illustrate, FIG. 3 is an example cross-section view along line A-A' of FIG. 2 illustrating a portion of an imaging system 300 including a color image sensor 302 having an array of microlenses 322 disposed over the optical isolation grid 320 in accordance with the teachings of the present invention. As shown in the depicted example, optical isolation grid 320 is disposed over a color filter array 310, which is disposed over a pixel array in accordance with the teachings of the present invention. As shown in the example, each pixel cell of color image sensor 302 includes a photodiode (PD) 324 to sense incident light 326. Color filter array 310 is disposed over the pixel cells of color image sensor 302 such that incident light 326 that is directed to the photodiodes 324 in the pixel cells of color image sensor 302 is directed through array of microlenses 322, optical isolation grid 320, and color filter array 310 as shown.

It is noted that color image sensor 302 of FIG. 3 is another example of color image sensor 102 of FIG. 1 or color image sensor 202 of FIG. 2, and/or that color filter array 310 of FIG. 3 is another example of color filter array 110 of FIG. 1 or color filter array 210 of FIG. 2, and/or that optical isolation grid 320 of FIG. 3 is another example of optical isolation grid 120 of FIG. 1 or of optical isolation grid 220 of FIG. 2, and/or that the array of microlenses 322 is another example of the array of microlenses 222 of FIG. 2. Accordingly, it is appreciated that similarly named and numbered elements referenced below are arranged and function similar to as described above.

Continuing with the example depicted in FIG. 3, example color filter array 310 is illustrated as including a red color filter 312, a green color filer 314, and a red color filter 312 disposed over, and aligned with underlying pixel cells arranged in the pixel array of image sensor 302. In the illustrated example, each pixel cell includes a photodiode 324 to sense incident light 326. The example depicted in FIG. 3 also shows that optical isolation grid 320 is disposed over the color filter array 310 such that incident light 326 is directed through microlenses 322 and optical isolation grid 320 prior to be being directed through the color filter array 310 to the respective photodiodes 324 in the pixel array. In the illustrated example, optical isolation grid 320 includes a plurality of sidewalls 318 arranged to define a plurality of openings in optical isolation grid 320 as shown.

As shown in the depicted example, each one of the plurality of openings defined by the plurality of sidewalls 318 is aligned with a corresponding underlying one of the plurality of color filters 312/314/312 of color filter array 310. As such, each one of the plurality of color filters 312/314/312 of color filter array 310 is optically isolated by the overlying optical isolation grid 320 to receive incident light 326 only through a corresponding aligned one of the plurality of openings of optical isolation grid 320 as shown in accordance with the teachings of the present invention. In one example, each one of the plurality of sidewalls 318 of the optical isolation grid 320 is aligned with a corresponding underlying boundary between neighboring color filters 312/314/312 of the color filter array 310 as shown.

The example depicted in FIG. 3 further illustrates that image sensor 302 may also include an array of microlenses 322 that are disposed over the optical isolation grid 320 in accordance with the teachings of the present invention. As shown in the depicted example, each one of the microlenses 322 of the array of microlenses is aligned with a corresponding one of the plurality of openings defined by the plurality of sidewalls 318. In one example, the array of microlenses 322 is formed with a lens material, and the plurality of openings in the optical isolation grid 320 is filled with the lens material of the array of microlenses 322 as shown.

In one example, the lens material that is used to form the array of microlenses 322 has an index of refraction of $n_2$. In one example, the index of refraction of the material used to form the plurality of sidewalls 318 is $n_1$. In one example, the index of refraction of the material used to form the plurality of sidewalls is less than the index of refraction of the lens material of the array of microlenses, $n_2$. Accordingly, since the lens material of the microlenses 322 has a different index of refraction than the material used to form the sidewalls 318, incident light 326 that is directed through microlenses 322 to an interface between the lens material used to form microlenses 322 and the material used to form the sidewalls 318 is deflected as shown in FIG. 3, which prevents incident light 326 from leaking into a neighboring color filter and/or a neighboring pixel cell in accordance with the teachings of the present invention.

To illustrate, as shown in the depicted example, the incident light 326 that is deflected at the interface between the lens material of microlenses 322 and the material of sidewalls 318 is deflected at an angle back into the lens material of microlens 322 and into the aligned underlying color filter 312/314/312 of color filter array 310 instead of leaking into a neighboring microlens/color filter/pixel cell to cause unwanted crosstalk. As a result, the plurality of sidewalls 318 of optical isolation grid 320 is adapted to isolate each one of the plurality of color filters 312/314/312 of color filter array 310 from receiving undesired incident light 326 from a neighboring one of the plurality of color filters 312/314/312 in accordance with the teachings of the present invention. Therefore, with the reduced crosstalk provided by the plurality of sidewalls 318 of optical isolation grid 320 disposed over color filter array 310 as discussed, undesirable noise in the image sensor 302 is reduced and overall image quality of images captured by the image sensor 302 is improved in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A color image sensor, comprising:
   a plurality of pixel cells arranged in a pixel array;
   a plurality of color filters arranged in a color filter array disposed over the pixel array, wherein each one of the plurality of color filters is aligned with a corresponding underlying pixel cell of the pixel array; and
   an optical isolation grid disposed over the color filter array such that incident light is directed through the optical isolation grid prior to be being directed through the color filter array to the pixel array, wherein the optical isolation grid includes a plurality of sidewalls arranged to define a plurality of openings in the optical isolation grid, wherein each one of the plurality of openings is aligned with a corresponding underlying one of the plurality of color filters such that each one of the plurality of color filters is optically isolated by the optical isolation grid to receive incident light only through a corresponding aligned one of the plurality of openings.

2. The color image sensor of claim 1 wherein each one of the plurality of sidewalls of the optical isolation grid is aligned with a corresponding underlying boundary between neighboring color filters of the color filter array.

3. The color image sensor of claim 1 wherein optical isolation grid is adapted to isolate each one of the plurality of color filters from receiving incident light from a neighboring one of the plurality of color filters.

4. The color image sensor of claim 1 wherein plurality of sidewalls of the optical isolation grid is comprised of a material having an index of refraction that is different from an index of refraction in the plurality of openings.

5. The color image sensor of claim 4 wherein the plurality of sidewalls is adapted to deflect the incident light from the plurality of openings.

6. The color image sensor of claim 1 further comprising an array of microlenses disposed over the optical isolation grid, wherein each one of the microlenses of the array of microlenses is aligned with a corresponding one of the plurality of openings of the optical isolation grid.

7. The color image sensor of claim 6 wherein each one of the microlenses of the array of microlenses is comprised of lens material, wherein the plurality of openings in the optical isolation grid is filled with the lens material of the array of microlenses.

8. The color image sensor of claim 6 wherein plurality of sidewalls of the optical isolation grid is comprised of a material having an index of refraction that is less than an index of refraction of the lens material of the array of microlenses.

9. The color image sensor of claim 8 wherein the plurality of sidewalls is adapted to deflect the incident light from the lens material in the plurality of openings.

10. An imaging system, comprising:
a color image sensor including:
a plurality of pixel cells arranged in a pixel array;
a plurality of color filters arranged in a color filter array disposed over the pixel array, wherein each one of the plurality of color filters is aligned with a corresponding underlying pixel cell of the pixel array; and
an optical isolation grid disposed over the color filter array such that incident light is directed through the optical isolation grid prior to be being directed through the color filter array to the pixel array, wherein the optical isolation grid includes a plurality of sidewalls arranged to define a plurality of openings in the optical isolation grid, wherein each one of the plurality of openings is aligned with a corresponding underlying one of the plurality of color filters such that each one of the plurality of color filters is optically isolated by the optical isolation grid to receive incident light only through a corresponding aligned one of the plurality of openings;
control circuitry coupled to the pixel array to control operation of the pixel array; and
readout circuitry coupled to the pixel array to readout image data from the plurality of pixels.

11. The imaging system of claim 10 further comprising function logic coupled to the readout circuitry to store the image data from each one of the plurality of pixel cells.

12. The imaging system of claim 10 wherein each one of the plurality of sidewalls of the optical isolation grid is aligned with a corresponding underlying boundary between neighboring color filters of the color filter array.

13. The imaging system of claim 10 wherein optical isolation grid is adapted to isolate each one of the plurality of color filters from receiving incident light from a neighboring one of the plurality of color filters.

14. The imaging system of claim 10 wherein plurality of sidewalls of the optical isolation grid is comprised of a material having an index of refraction that is different from an index of refraction in the plurality of openings.

15. The imaging system of claim 14 wherein the plurality of sidewalls is adapted to deflect the incident light from the plurality of openings.

16. The imaging system of claim 10 wherein the color image sensor further includes an array of microlenses disposed over the optical isolation grid, wherein each one of the microlenses of the array of microlenses is aligned with a corresponding one of the plurality of openings of the optical isolation grid.

17. The imaging system of claim 16 wherein each one of the microlenses of the array of microlenses is comprised of lens material, wherein the plurality of openings in the optical isolation grid is filled with the lens material of the array of microlenses.

18. The imaging system of claim 16 wherein plurality of sidewalls of the optical isolation grid is comprised of a material having an index of refraction that is less than an index of refraction of the lens material of the array of microlenses.

19. The imaging system of claim 18 wherein the plurality of sidewalls is adapted to deflect the incident light from the lens material in the plurality of openings.

* * * * *